United States Patent [19]
Nakamura et al.

[11] 4,037,121
[45] July 19, 1977

[54] PIEZOELECTRICALLY DRIVEN TUNING FORK WITH HARMONIC SUPPRESSION

[75] Inventors: Takeshi Nakamura; Hiroshi Nishiyama, both of Hakui, Japan

[73] Assignee: Murata Manufacturing Co., Ltd., Nagaokakyo, Japan

[21] Appl. No.: 670,955

[22] Filed: Mar. 26, 1976

[30] Foreign Application Priority Data

Mar. 31, 1975 Japan .................................. 50-39663

[51] Int. Cl.² ............................................ H01L 41/04
[52] U.S. Cl. ...................................... 310/8.2; 310/25; 84/409
[58] Field of Search ................... 310/8.2, 8.5, 8.6, 25; 50/23 R, 23 TF, 23 U; 84/404, 457

[56] References Cited

U.S. PATENT DOCUMENTS

| 309,138 | 12/1884 | Fischer | 84/409 |
|---|---|---|---|
| 1,637,442 | 8/1927 | Dorsey | 310/25 X |
| 2,581,963 | 1/1952 | Langloys | 84/409 |
| 3,308,361 | 3/1967 | Nakai et al. | 310/25 X |
| 3,480,809 | 11/1969 | Grib | 310/25 |
| 3,593,516 | 7/1971 | Mayer | 310/25 X |
| 3,597,642 | 8/1971 | Kurino | 310/8.2 |
| 3,759,133 | 9/1973 | Budych et al. | 310/25 X |
| 3,760,482 | 9/1973 | Kawamura | 58/23 TF |

Primary Examiner—Mark O. Budd
Attorney, Agent, or Firm—Birch, Stewart, Kolasch & Birch

[57] ABSTRACT

An electrically driven tuning fork of the piezoelectric type, electromagnetic type or the like for use in electrical and electronic equipment which includes a tuning fork vibrator and electrical elements for driving the tuning fork vibrator. The two-pronged tuning fork vibrator has a pair of rectangular projections integrally formed with the prongs on corresponding side edges of the said prongs at one side of the tuning fork, excepting opposite end portions of the prongs adjacent to the node and in same embodiments, both the mode and antinode of the fundamental harmonic oscillation of the tuning fork for suppressing undesirable oscillation other than the fundamental harmonic oscillation of the tuning fork. Electrical elements are affixed onto the outer or inner surfaces of the prongs.

25 Claims, 22 Drawing Figures

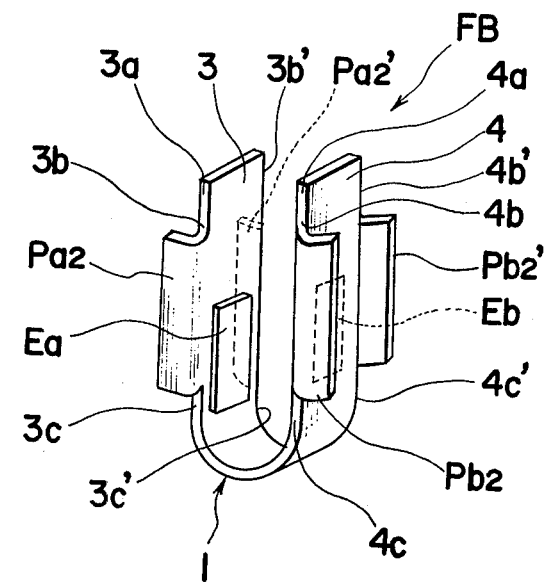
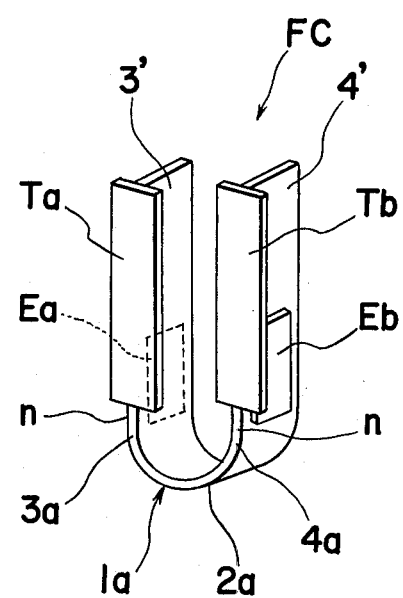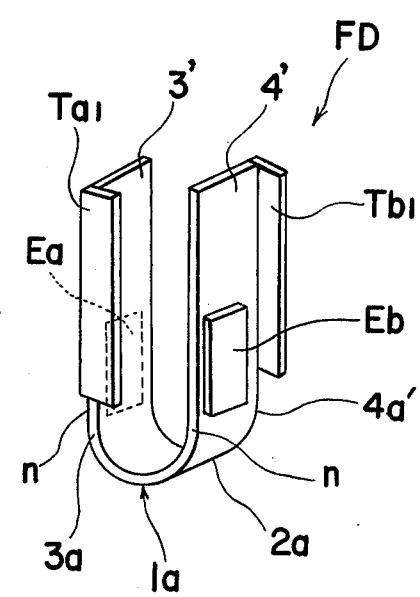

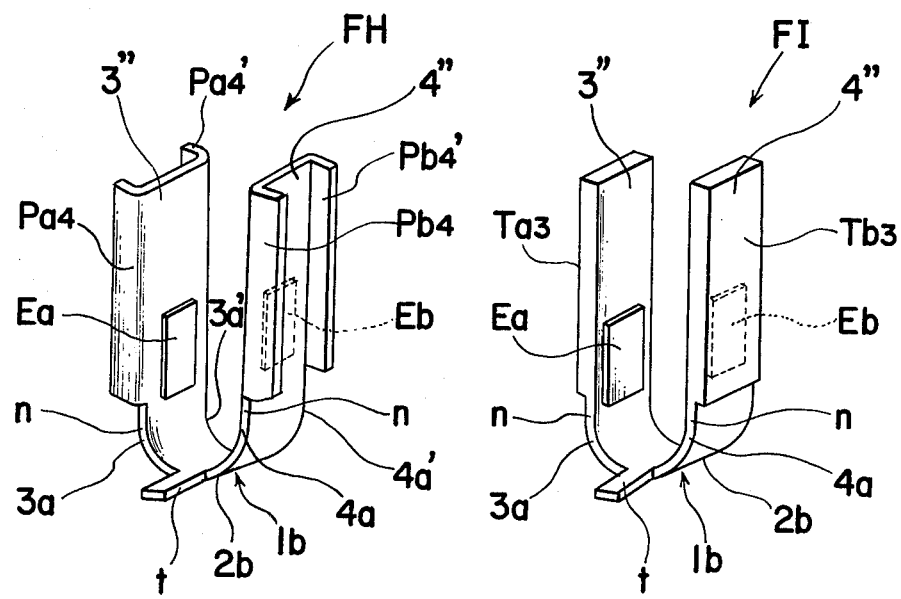
FIG. 13
FIG. 14
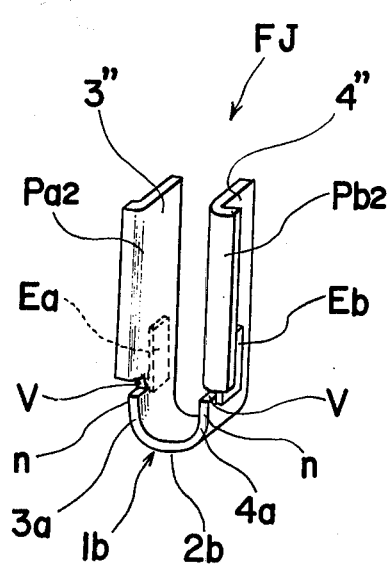
FIG. 15
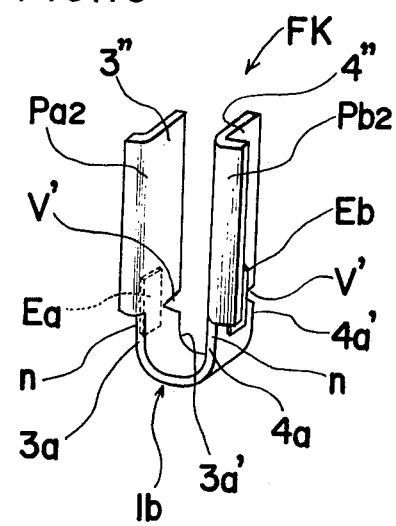
FIG. 16

PIEZOELECTRICALLY DRIVEN TUNING FORK WITH HARMONIC SUPPRESSION

The present invention relates to an electrically driven tuning fork and more particularly, to a tuning fork vibrator for use in electrically driven tuning forks of the piezo-electric type, electromagnetic type and the like.

Figure 3:
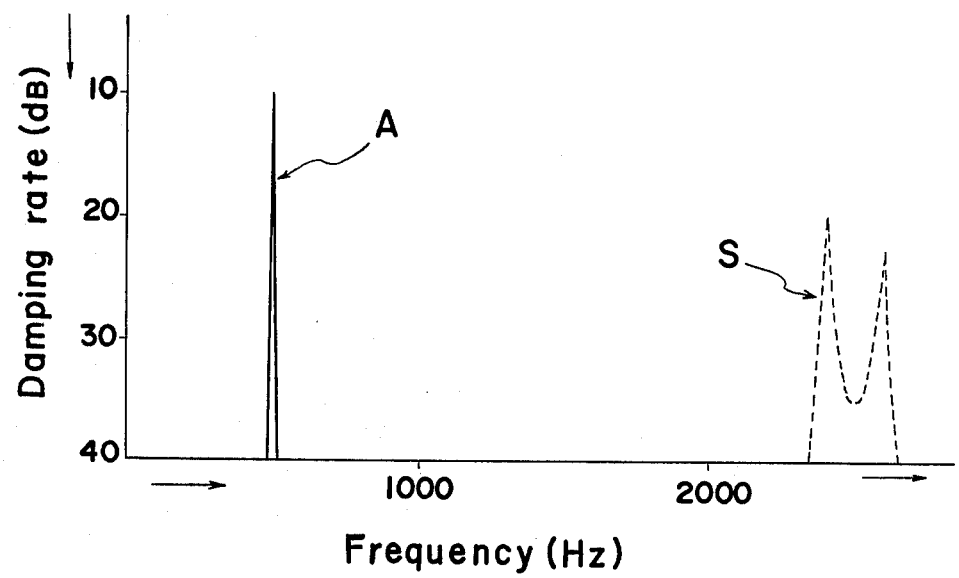
Figure 4:
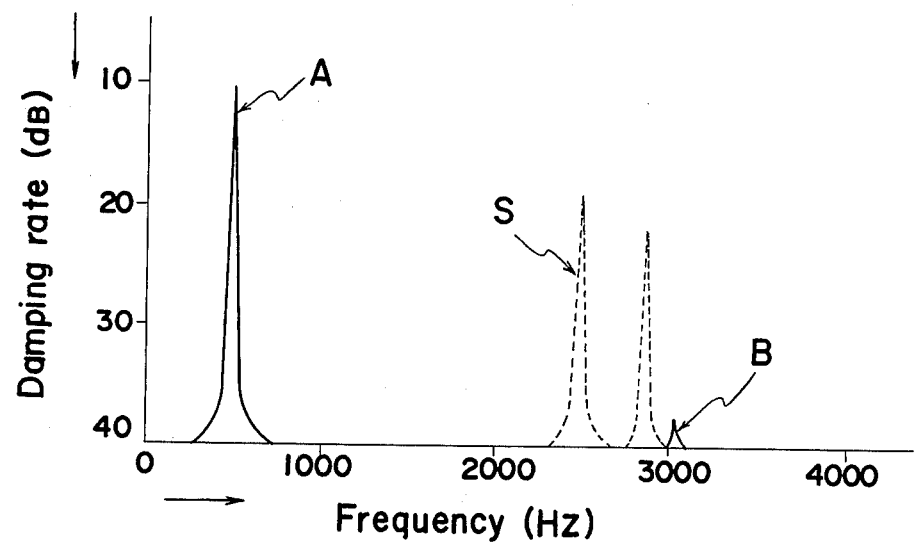

Generally, an electrically driven tuning fork, for example, of the piezo-electric type has recently been broadly applied to electrical and electronic equipment in various fields of industry. Referring to FIGS. 3 and 4 showing damping characteristics of tuning forks, the conventional tuning fork of the above described type has frequency characteristics wherein higher harmonic oscillation, i.e., primary higher harmonic oscillation is generated as shown by dotted lines S, thus the applicable frequency range thereof being limited, with consequent reduction of the number of channel to be established therein, which oscillation S other than the fundamental harmonic oscillation A should be suppressed as in FIG. 3 or to such a level as shown by a real line B in FIG. 4 for making the tuning fork free from erroneous functioning and applicable to a wide frequency range with increased number of channels established therein. Commonly, the tuning forks, for example, of piezo-electric type are produced in the frequency range from 50Hz up to approximately 4KHz, and if a piezo-electric tuning fork having a fundamental harmonic oscillation, for example, of 300Hz is employed, the primary higher harmonic oscillation is generated in the vicinity of 1800KHz which is approximately 5 to 6 times the fundamental harmonic oscillation, thus the applicable frequency range being limited to 300 to 1800Hz, with consequent reduction in the number of channels to be taken in the tuning fork, in which case, any attempts to unduly widen the frequency band may possibly result in malfunction of the tuning fork.

Figure 1:
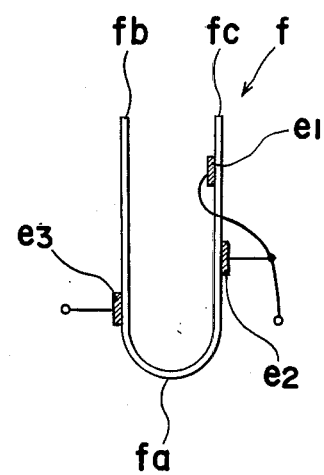
Figures 2A, 2B:
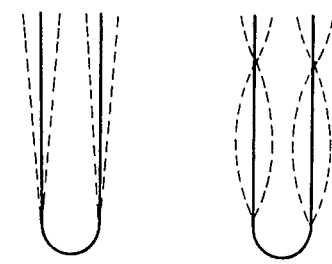

In order to overcome the disadvantages as described above, there has conventionally been proposed a piezo-electric tuning fork $f$ having construction as shown in FIG. 1, in which a two pronged tuning fork vibrator fa of U-shape has detecting piezo-electric elements $e1$ and $32$ affixed to inner and outer surfaces of its one prong fc at positions close to the free end and central portions of the prong $fc$, respectively, i.e., at the node and antinode of higher harmonic oscillation of the tuning fork vibrator fa, whereby the detected signals are cancelled each other. Onto the outer surface of the other prong $fb$ at a position thereof remote from its free end and adjacent to the curved portion or bend of the fork $f$, there is affixed a driving piezo-electric element $e3$. In FIGS. 2(a) and 2(b), the fundamental harmonic oscillation mode and the primary higher harmonic oscillation mode of such a tuning fork are shown by dotted lines respectively. The prior art piezo-electric tuning fork $f$ of the above described construction still has various disadvantages that, in the manufacture of piezo-electric tuning forks having various fundamental harmonic oscillations, it is necessary to determine position and to design sizes of detecting piezo-electric elements according to each of such fundamental harmonic oscillations, the manufacturing process of the tuning forks thus being complicated, with troublesome procedures involved therein. It is to be noted that electromagnetic tuning forks also have similar disadvantages to those described above with reference to the piezo-electric tuning forks.

Accordingly, an essential object of the present invention is to provide a tuning fork vibrator for use in tuning forks of the piezo-electric type, electromagnetic type and the like which is capable of suppressing higher harmonic oscillation for utilizing a wide frequency band so as to provide as many channels as possible.

Another important object of the present invention is to provide a tuning fork vibrator of the above described type which is stable in functioning without any malfunction.

A further object of the present invention is to provide a tuning fork vibrator of the above described type which is simple in construction and readily manufactured at low cost.

Figure 5:
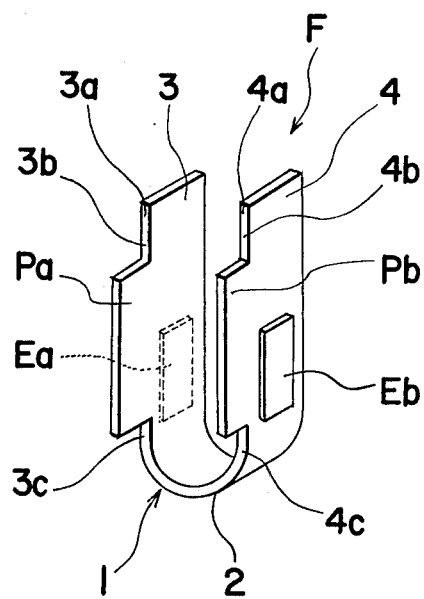
Figure 10:
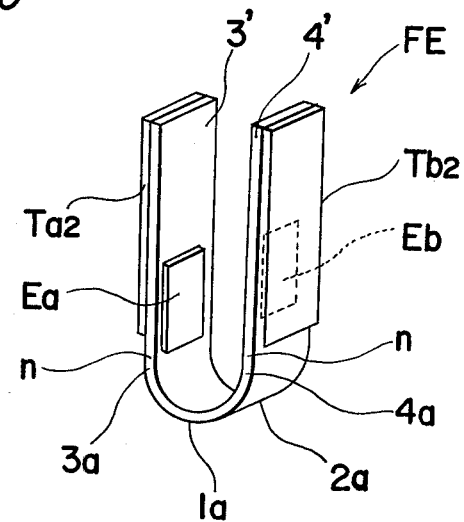
Figure 11:
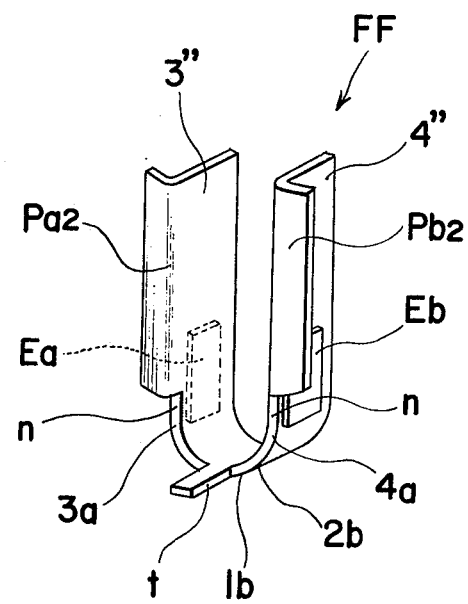
Figure 12:
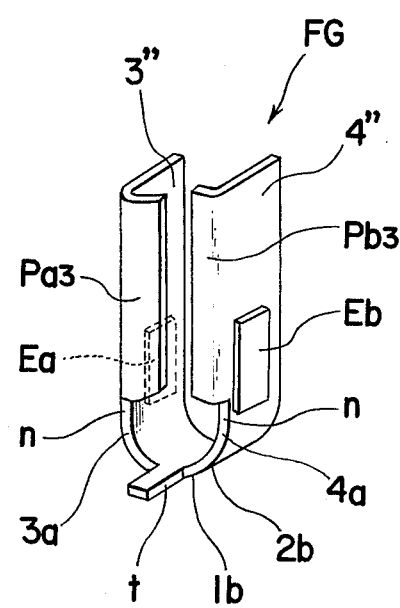
Figure 17:
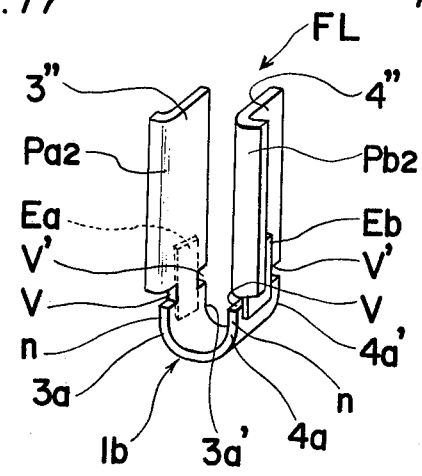
Figure 18:
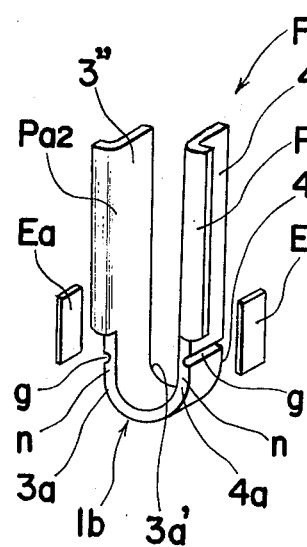
Figure 19:
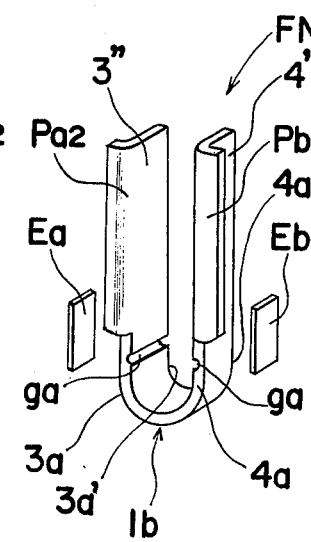
Figure 20:
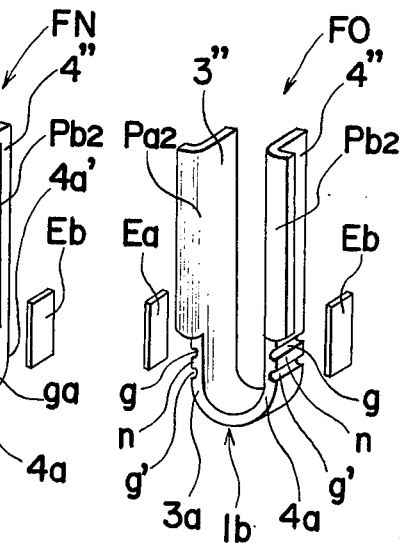

According to a preferred embodiment of the present invention, the piezo-electric tuning fork includes a two-pronged tuning fork vibrator, and a pair of rectangular projections integrally formed with the prongs on corresponding side edges of said prongs at one side of the tuning fork, excepting opposite end portions of the prongs adjacent to node and antinode portions of the fundamental harmonic cscillation of the tuning fork, with piezo-electric elements being affixed onto the outer surfaces of the prongs, by which simple arrangement, oscillation other than the fundamental harmonic oscillation, i.e., the undesirable primary higher harmonic oscillation S as shown in FIG. 3 or FIG. 4 is almost completely suppressed, thus providing tuning forks which are free from malfunction and which are applicable to a wide frequency range, with an increased number of channels to be established therein. These and other objects and features of the present invention will become apparent from the following description taken in conjunction with the preferred embodiment thereof with reference to the accompanying drawings in which;

FIG. 5 is a perspective view of a piezo-electric tuning fork according to one embodiment of the present invention, FIGS. 6 to 14 are similar views to FIG. 5, but particularly show modification thereof, FIGS. 15 to 17 are similar views to FIG. 11, but particularly show modifications thereof, and FIGS. 18 to 20 are exploded views showing further modifications of the tuning fork of FIG. 11.

Before the description of the present invention proceeds, it is to be noted that like parts are designated by like reference numerals throughout several views of the accompanying drawings.

Referring now to FIG. 5, there is shown a tuning fork F of the invention which includes a tuning fork vibrator 1 of the U-shape having two rectangular prongs 3 and 4 extending upwardly, in parallel and spaced relation to each other, from a curved portion or bend 2 of the vibrator 1, the said bend 2 having semi-circular cross section. The prongs 3 and 4 have side edges $3a$ and $4a$ extending forwardly to a certain extent in the same direction from their central portions to form rectangular projections P$a$ and P$b$ integral with the prongs 3 and 4, except corresponding opposite side portions $3b$ and $3c$, and $4b$ and $4c$ of the prongs 3 and 4 i.e., node and antinode portions of said prongs 3 and 4. The prongs 3 and 4 further have rectangular piezo-electric elements E$a$ and E$b$ suitably affixed to the lower portions of their outeer surfaces i.e., adjacent to the node portions thereof as shown, by which arrangement, oscillations (the primary higher harmonic oscillation S shown in the dotted lines in FIGS. 3 and 4) other than fundamental harmonic oscillation shown in the real line A in FIG. 3 are advantageously suppressed.

Figure 6:
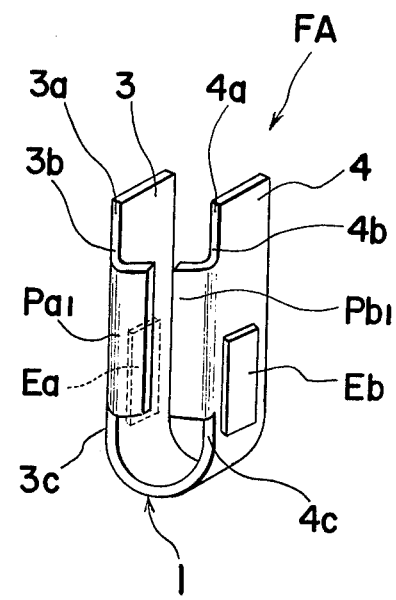

Referring to FIGS. 6 to 10, there are shown modifications of the tuning fork F of FIG. 5. In the tuning fork FA of FIG. 6, the projections Pa and Pb described as extending forwardly from the prongs 3 and 4 in the tuning fork F of FIG. 5 is further bent inwardly toward each other at right angles to the surfaces of the prongs 3 and 4, with front edges of the bent projections Pa1 and Pb1 being arranged to face in spaced relation to each other, while in the modification of FIG. 7, the tuning fork FB is provided with two pairs of projections Pa2 and Pb2, and Pa2' and Pb2', which are extending forwardly from opposite side edges of the prongs 3 and 4 and which are bent outwardly away from each other at right angles to the surfaces of the prongs 3 and 4, thus forming channel-shaped portions on each of the prongs 3 and 4 except corresponding opposite side portions 3b and 3c, 3b' and 3c', 4b and 4c, and 4b' and 4c'. In this modification, the piezo-electric elements Ea and Eb described as affixed to the outer surface of the prongs 3 and 4 in the tuning forks F and FA of FIGS. 5 and 6 are affixed to inner surfaces of the prongs 3 and 4 instead, which elements Ea and Eb may of course be applied to the outer surfaces of the prongs 3 and 4 depending on necessity as in the tuning forks F and FA.

As is seen from the foregoing description, according to the tuning forks of FIGS. 5 to 7 of the invention, projections are formed on the side edges of the prongs except at opposite end portions thereof, or at the node and antinode portions of the fundamental harmonic oscillation of the tuning fork, by which arrangement, the higher harmonic oscillation of the tuning fork can advantageously be suppressed. Thus tuning forks free from malfunction and applicable to a wide frequency range are provided with an increased number of channels capable of being established therein.

Referring particularly to FIGS. 8 to 10, the tuning fork vibrator 1a has similar U-shape to that of FIGS. 5 to 7, but projections described as formed on the prongs are replaced by metallic plate members mentioned hereinbelow. In the modification of FIG. 8, the tuning fork FC includes a tuning fork vibrator 1a of U-shape having two rectangular prongs 3' and 4' extending upwardly, in parallel and spaced relation to each other, from the bend 2a of the vibrator 1a having semi-circular cross section.

A pair of rectangular metallic plates Ta and Tb separately prepared are affixed, at their longitudinal axes, to edges 3a and 4a of the prongs 3' and 4' at one side of the vibrator 1a except for the node portion n of the fundamental oscillation of the fork 1a. The prongs 3' and 4' are further provided with piezo-electric elements Ea and Eb affixed to outer surfaces thereof. In the tuning fork FD of FIG. 9, the metallic plates Ta and Tb described as affixed on side edges 3a and 4a of the prongs 3' and 4' at one side of the vibrator 1a in the fork of FIG. 8 are replaced by similar metallic plates Ta1 and Tb1, one plate Ta1 of which is affixed, at its surface adjacent to one longitudinal side edge thereof, to the side edge 3a of the prongs 3' so as to extend inwardly at right angles from the prong 3' at one side of the fork FD, while the other plate Tb1 is affixed, at its surface adjacent to one longitudinal side edge thereof, to the side edge 4a' of the prong 4' so as to extend outwardly at right angles from the prong 4' at the other side of the fork FD as shown. In the tuning fork FE of FIG. 10, metallic plates Ta2 and Tb2 having the same width as that of the prongs 3' and 4' are affixed to the outer surfaces of the prongs 3' and 4' to form stepped portions or projections of increased thickness thereat, with the piezo-electric elements Ea and Eb being applied onto the inner surfaces of the prongs 3' and 4', the width of which plates Ta2 and Tb2 may be increased or decreased to obtain optimum function of the tuning fork FE.

It should be noted here that the affixing of the metallic plates Ta and Tb, Ta1 and Tb1, or Ta2 and Tb2 of FIGS. 8 to 10 onto the prongs 3' and 4' may be effected by any suitable means, for example, with adhesives, through welding or the like, and that such metallic plates may be replaced by equivalent plates of resinous material.

As is clear from the foregoing description, according to the tuning forks of FIGS. 7 to 10, metallic plates or plates of resinous material are affixed onto outer or inner surfaces or side edges of the prongs except for the node portions of the tuning forks so as to suppress the undesirable higher harmonic oscillation, thus making it possible to provide tuning forks free from malfunction and applicable to a wide frequency range with increased number of channels obtained therefrom.

Referring now to FIGS. 11 to 14, there are shown further modifications of the tuning fork F of FIG. 5. In the tuning fork FF of FIG. 11, the prongs 3" and 4" have side edges thereof extending outwardly to a certain extent in the same direction and bent outwardly away from each other at right angles to the surfaces of the prongs 3" and 4" to form projections Pa2 and Pb2 as shown except at the node portions of the fundamental oscillation of the fork FF. A support arm t for the tuning fork FF extends forwardly to a certain extent from the edge of the lowest portion of the bend 2b of the vibrator 1b, while the piezo-electric elements Ea and Eb are affixed to the outer surfaces of the prongs 3" and 4" at the node portions n of the latter. It is to be noted here that by the provision of the bent portions or projections Pa 2 and Pb2 on the side edges 3a and 4a of the prongs 3" and 4", the antinode of the higher harmonic oscillation is suppressed without suppressing the fundamental harmonic oscillation, and other oscillations (the primary higher harmonic oscillation S) than the fundamental harmonic oscillation A are almost completely suppressed as shown in the real line B of FIG. 4. In the tuning fork FG of FIG. 12, the projections Pa 2 and Pb 2 described as directed outwardly away from each other in the tuning fork FF of FIG. 11 are replaced by similar projections Pa 3 and Pb 3 bent inwardly toward each other at right angles to the surfaces of the prongs 3" and 4", with front edges of the projections Pa 3 and Pb 3 facing in spaced relation to each other, while in the modification of FIG. 13, the tuning fork FH is provided with two pairs of projections Pa4 and Pb4, and Pa4' and Pb4', which are extending outwardly from opposite side edges 3a and 4a, and 3a' and 4a' of the prongs 3" and 4" except at the node portions n of said prongs and which are bent outwardly away from each other at right angles to the surfaces of the prongs 3" and 4", thus forming channel-shaped portions on each of the prongs 3" and 4", with the piezo-electric elements Ea and Eb being affixed to the inner surfaces of the prongs 3" and 4" at the node portions n of the latter. It should be noted here that the projections Pa4 and Pb4, and Pa4" and Pb4' described as bent outwardly away from each other respectively in the tuning fork FH of FIG. 13 may be bent inwardly towards each other so long as the optimum functioning of the tuning fork is achieved. In the modified tuning fork FI of FIG. 14, stepped portions or projections Ta3 and Tb3 are integrally formed on the outer surfaces of the prongs 3" and 4" except at the node portions n of the latter, with the piezo-electric elements Ea and Eb being affixed to the inner surfaces of the prongs 3" and 4" at their node portions n. It is to be noted here that the stepped portions Ta3 and Tb3 described as formed on the outer surfaces of the prongs 3" and 4" in the tuning fork FI of FIG. 14 may be formed on the inner surfaces of the prongs 3" and 4".

As is seen from the foregoing description, according to the tuning forks of FIGS. 11 to 14 of the invention, the bent projections or the stepped portions are integrally formed with the outer or inner surfaces or side edges of the prongs for suppressing the undesirable higher harmonic oscillation through simple construction, by which arrangement, tuning forks free from malfunction and applicable to a wide frequency range with an increased number of channels obtained therefrom are advantageously presented.

Referring now to FIGS. 15 to 20, there are shown still further modifications of the tuning fork FF of FIG. 11. In the tuning fork FJ of FIG. 15, the support arm t described as integrally formed with the side edge of the bend 2b of the tuning fork FF of FIG. 11 is dispensed with, although such a support arm may of course be formed depending on the necessity, while notches V are formed in the forward side edges 3a and 4a of the prongs 3" and 4" in positions immediately below the bent projections Pa2 and Pb2 and in the vicinity of the node portions n of the prongs 3" and 4", with the piezo-electric elements Ea and Eb being affixed to the surfaces of the node portions n of the same prongs 3" and 4", by which arrangement, the effect for suppressing the higher harmonic oscillation by the bent projections Pa2 and Pb2 is further enhanced by the presence of the notches V, thus oscillations (primary higher harmonic oscillation S) other than the fundamental harmonic oscillation A being almost completely suppressed as shown in the real line B in FIG. 4 earlier mentioned. In the modified tuning fork FK of FIG. 16, the notches V described as formed in the front side edges 3a and 4a of the prongs 3" and 4" adjacent to the node portions n thereof in FIG. 15 are disposed with, and similar notches V" are formed in the corresponding rear side edges 3a' and 4a" of the prongs 3" and 4", while in the tuning fork FL of FIG. 17, the notches V and V, and V' and V' are formed in both side edges 3a and 4a, and 3a' and 4a' of the prongs 3" and 4" as shown. It should be noted that in the modifications of FIGS. 15 to 17 also, the bent projections Pa2 and Pb2 may be formed at any portions of the side edges 3a and 4a, or 3a' and 4a', provided that such projections Pa2 and Pb2 are arranged to locate in positions except at the node portions n of the fundamental harmonic oscillation, and that the notches V and V' may be of any shape or size, if these notches sufficiently serve the purpose for suppressing the higher harmonic oscillation.

As is clear from the foregoing description, according to the tuning forks of FIGS. 15 to 17 of the invention, the undesirable higher harmonic oscillations are almost perfectly suppressed through simple construction wherein the notches are formed in the side edges of the prongs in the vicinity of the node portions of the fundamental harmonic oscillation, with the bent projections being integrally formed with the prongs in the positions except the node portions of said prongs, which arrangement is particularly effective for providing tuning forks free from erroneous functioning and applicable to a wide frequency range, with an increased number of channels capable of being established therein. Furthermore, the tuning forks of the invention are suited to mass production at low manufacturing cost because of their simple construction.

Reference is had to FIGS. 18 to 20 showing another modifications of the tuning fork FF of FIG. 11. In the tuning fork FM of FIG. 18, the support arm t described as integrally formed with the side edges of the bend 2b of the tuning fork FF of FIG. 11 is also dispensed with, although such a support arm may be provided depending on necessity, while lateral grooves g extending the widths of the prongs 3" and 4" are formed on the outer surfaces of the prongs 3" and 4" between their side edges 3a and 3a', and 4a and 4a' in positions adjacent to the node portions n of the fundamental harmonic oscillation of the latter, to which node portions n the piezo-electric elements Ea and Eb are affixed. In the modified tuning fork FN of FIG. 19, the grooves g described as formed on the outer surfaces of the prongs 3" and 4" in the tuning fork FM of FIG. 18 are dispensed with, and similar grooves ga are formed in the corresponding positions of the inner surfaces of the prongs 3" and 4" as shown, while in the tuning fork FO of FIG. 20 showing a modification of the tuning fork FM of FIG. 18, other lateral grooves g' are respectively formed on the outer surfaces of the prongs 3" and 4" in positions immediately below the grooves g in the vicinity of the node portions n. The formation of the grooves g, ga and g' on the prongs 3" and 4" is particularly effective for further enhancing the suppression of the primary higher harmonic oscillation by the bent projections Pa2 and Pb2. It should be noted here that the grooves may be formed either in the outer surfaces or inner surfaces, or both inner and outer surfaces of the prongs, and that the number of the grooves may be increased depending on necessity. It should also be noted that the tuning forks F to FL of FIGS. 5 to 17 may further be provided, at their node portions, with the grooves described with reference to the tuning forks FM to FO of FIGS. 18 to 20.

As is seen from the foregoing description, according to the tuning forks FJ to FO of FIGS. 15 to 20, notches and grooves are formed in the outer or inner surfaces of the prongs in the vicinity of the node portions of said prongs, with projections or stepped portions (FIGS. 10 and 14) being formed on the same prongs except at their node portions, by which arrangement, the undesirable higher harmonic oscillation is more perfectly suppressed than in the tuning forks having only projections or stepped portions. Thus tuning forks of simple construction free from erroneous function and applicable to a wide frequency range, with increased numbers of channels to be obtained therefrom are presented at low cost through simple manufacturing process, and the phenomenon experienced in the tuning forks of FIGS. 5 to 14 wherein the level of the higher harmonic component thereof tends to vary due to variables of supporting conditions of the tuning forks is advantageously eliminated. Thus simplification of the manufacturing of tuning forks is achieved without any correction required therefor.

Incidentally, in actual practice, tuning forks having various fundamental harmonic oscillations are required depending on their end use, for which purpose, prongs of tuning forks preliminarily machined to a predetermined length are further adjusted for length individually to obtain necessary fundamental oscillation. The adjustment of the prong length in this manner, however, inevitably causes the antinode of the higher harmonic oscillation to move to a certain extent. According to the present invention, since the projections or plate members are integrally formed or affixed to the prongs, the higher harmonic oscillation is advantageously suppressed as described earlier. However, in the foregoing embodiments of FIGS. 5 to 7 and 11 to 20 wherein the projections are integrally formed with the prongs, if the lengths of the prongs are adjusted in the above described manner, positions of the projections may deviate from the portions of the prongs equivalent to the antinode of the higher harmonic oscillation, thus resulting in insufficient suppression of the undesirable higher harmonic oscillation. In such cases, the arrangements in the tuning forks FC to FE of FIGS. 8 to 10 are very effective in that the plate members separately prepared may be positioned and secured, with adhesives or the like, on the antinode portions of the higher harmonic oscillation which differ from one tuning fork to another. It is needless to say that the above concept is also applicable to the tuning forks of FIGS. 5 to 7 and 11 to 20 by preparing the prongs and the projections separately as in the tuning forks of FIGS. 8 to 10. One example of such arrangement is given in FIG. 21 showing a further modification of the tuning fork FC of FIG. 8.

Figure 21:
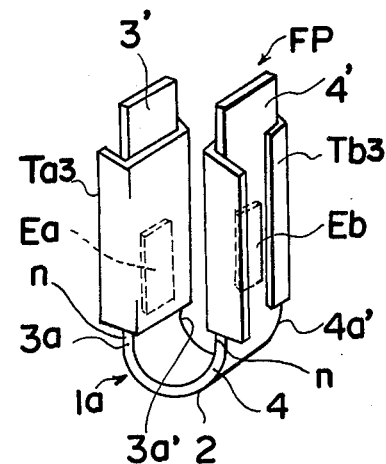

In the tuning fork FP of FIG. 21, the rectangular metallic plates T$a$ and T$b$ described as affixed, at their longitudinal axes, to edges 3$a$ and 4$a$ of the prongs 3' and 4' at one side of the vibrator 1$a$ in the tuning fork FC of FIG. 8 are replaced by shaped plates T$a$3 and T$b$3 each bent at a portion adjacent to one side edge thereof to hold the edges 3$a$' 4$a$' of the prongs 3' and 4' at one side of the vibrator 1$a$, for permitting sliding movements of the shaped plates T$a$3 and T$b$3 along the edges 3$a$' and 4$a$' of the vibrator 1$a$, while portions adjacent to the other side edges of the plates T$a$3 and T$b$3 are bent outwardly away from each other to form projections extending from the edges 3$a$ and 4$a$ of the vibrator 1$a$ as shown, by which arrangement, the adjustment of the positions for the projections is readily effected through mere sliding movement of the plates T$a$3 and T$b$3 along the prongs 3' and 4' in the longitudinal direction of said prongs 3' and 4'.

It should be noted here that in the foregoing description, although the present invention has been described with reference to tuning forks of the piezo-electric driving type, exactly the same construction of tuning fork vibrators can be employed for electrically driven tuning forks of the electromagnetic driving type of the like.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as included therein.

What is claimed is:

1. An electrically driven tuning fork for use in electrical and electronic equipment which comprises a tuning fork vibrator having two prongs and electrical elements applied to said prongs for driving said tuning fork vibrator, said prongs having inner and outer surfaces defined between side edges thereof;

said tuning fork vibrator including projections formed on said prongs and extending over substantially the length of said prongs, except over node portions of fundamental harmonic oscillation thereof, said projections acting to stiffen said prongs so as to suppress higher harmonic oscillation in said tuning fork vibrator.

2. An electrically driven tuning fork as claimed in claim 1, wherein said tuning fork vibrator further includes notches formed in said side edges of said prongs in positions adjacent to said node portions.

3. An electrically driven tuning fork as claimed in claim 1, wherein said tuning fork vibrator further includes substantially transverse grooves formed in said surfaces of said prongs in positions adjacent to said node portions.

4. An electrically driven tuning fork as claimed in claim 1, wherein said prongs are integrally formed, except the node and antinode portions of the fundamental harmonic oscillation thereof, with said projections which extend forwardly in spaced and parallel relation to each other from said side edges of said prongs, at one side of said tuning fork.

5. An electrically driven tuning fork as claimed in claim 1, wherein said prongs are integrally formed, except the node and antinode portions of the fundamental harmonic oscillation thereof, with said projections which extend inwardly towards each other at right angles from said side edges of said prongs so as to face each other at corresponding edges thereof through a space therebetween, at one side of said tuning fork.

6. An electrically driven tuning fork as claimed in claim 1, wherein said prongs are integrally formed, except the node and antinode portions of the fundamental harmonic oscillation thereof, with said projections which extend outwardly away from said each other at right angles from side edges of said prongs, at both sides of said tuning fork.

7. An electrically driven tuning fork as claimed in claim 1, wherein said prongs are integrally formed, except the node portions of the fundamental harmonic oscillation thereof, with said projections which extend outwardly away from each other at right angles from said edges of said prongs, at one side of said tuning fork.

8. An electrically driven tuning fork as claimed in claim 7, wherein said prongs are further provided with notches formed therein in said side edges at positions adjacent to said node portions and immediately below said projections, at the said one side of said tuning fork whereat said projections are formed.

9. An electrically driven tuning fork as claimed in claim 7, wherein said prongs are further provided with notches formed therein in said side edges at positions adjacent to said node portions, at the other side of said tuning fork opposite to the said one side whereat the projections are formed.

10. An electrically driven tuning fork as claimed in claim 7, wherein said prongs are further provided with notches formed therein in said side edges at positions adjacent to said node portions, at both sides of said tuning fork.

11. An electrically driven tuning fork as claimed in claim 7, wherein said prongs are further provided with grooves extending across the width of said prongs and formed on said outer surfaces of said prongs in positions adjacent to said node portions.

12. An electrically driven tuning fork as claimed in claim 7, wherein said prongs are further provided with grooves extending across the width of said prongs and formed on said inner surfaces of said prongs in positions adjacent to said node portions.

13. An electrically driven tuning fork as claimed in claim 11, wherein said prongs are further provided with other grooves extending across the width of said prongs and formed in the outer surfaces of said prongs parallel to said first mentioned grooves in positions adjacent to said node portions.

14. An electrically driven tuning fork as claimed in claim 1, wherein said prongs are integrally formed, except the node portions of the fundamental harmonic oscillation thereof, with said projections which extend inwardly towards each other at right angles from said side edges of said prongs so as to face each other at corresponding edges thereof through a space therebetween, at one side of said tuning fork.

15. An electrically driven tuning fork as claimed in claim 1, wherein said prongs are integrally formed, except the node portions of the fundamental harmonic oscillation thereof, with said projections which extend outwardly away from each other at right angles from said side edges of said prongs, at both sides of said tuning fork.

16. An electrically driven tuning fork as claimed in claim 1, wherein said prongs are integrally formed, except the node portions of the fundamental harmonic oscillation thereof, with said projections which are provided on said outer surfaces of said prongs to form stepped portions of increased thickness thereat.

17. An electrically driven tuning fork as claimed in claim 1, wherein said prongs are integrally formed, except the node portions of the fundamental harmonic oscillation thereof, with said projections which are provided on said inner surfaces of said prongs to form stepped portions of increased thickness thereat.

18. An electrically driven tuning fork as claimed in claim 1, wherein said prongs are provided, except the node portions of the fundamental harmonic oscillation thereof, with separate plate members attached to said prongs to form said projections thereat.

19. An electrically driven tuning fork as claimed in claim 18, wherein said separate plate members are affixed, at the longitudinal axes thereof, to corresponding side edges of said prongs, at one side of the tuning fork.

20. An electrically driven tuning fork as claimed in claim 18, wherein said separate plate members is affixed, at its surface adjacent to a longitudinal side edge thereof, to one of said side edges of said prongs so as to extend inwardly at right angles from one of said prongs, at one side of said tuning fork, with the other of said separate plate members being affixed, at its surface adjacent to a longitudinal side edge thereof, to another of said side edges of said prongs so as to extend outwardly at right angles from the said other of said prongs, at the other side of said tuning fork.

21. An electrically driven tuning fork as claimed in claim 18, wherein said separate plate members are affixed to said outer surfaces of said prongs to form said projections of increased thickness thereat.

22. An electrically driven tuning fork as claimed in claim 18, wherein said separate plate members are affixed to said inner surfaces of said prongs to form said projections of increased thickness thereat.

23. An electrically driven tuning fork as claimed in claim 18, wherein said separate plate members are of metallic material.

24. An electrically driven tuning fork as claimed in claim 18, wherein said separate plate members are of resinous material.

25. An electrically driven tuning fork as claimed in claim 18, wherein said separate plate members are each bent at a portion adjacent to one side edge thereof to hold a corresponding said side edge of each of said prongs at one side of said tuning fork for permitting sliding movement of said plate members along and in direction parallel to the side edge of said prongs, and wherein, portions adjacent to the other side edges of said plate members being bent outwardly away from each other to form projections extending from said other side edges of said prongs at the other side of said tuning fork.

* * * * *